United States Patent
Sasaki

(10) Patent No.: US 7,459,243 B2
(45) Date of Patent: Dec. 2, 2008

(54) METHOD OF CORRECTING MASK PATTERN

(75) Inventor: Suguru Sasaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 665 days.

(21) Appl. No.: 10/942,034

(22) Filed: Sep. 16, 2004

(65) Prior Publication Data

US 2005/0136339 A1   Jun. 23, 2005

(30) Foreign Application Priority Data

Dec. 19, 2003   (JP)   ............................. 2003-422158

(51) Int. Cl.
*G03F 1/00* (2006.01)

(52) U.S. Cl. .......................................................... 430/5

(58) Field of Classification Search .................. 430/5, 430/394

See application file for complete search history.

(56) References Cited

U.S. PATENT DOCUMENTS 5,546,225 A * 8/1996 Shiraishi ...................... 359/559
5,862,058 A    1/1999 Samuels et al.
5,991,006 A * 11/1999 Tsudaka ....................... 355/53
6,168,891 B1    1/2001 Shibata

FOREIGN PATENT DOCUMENTS

| JP | 11-218899 | 8/1999 |
| JP | 2000-162758 | 6/2000 |
| JP | 2001-174974 | 6/2001 |

* cited by examiner

*Primary Examiner*—Stephen Rosasco
(74) *Attorney, Agent, or Firm*—Kubotera & Associates, LLC

(57) ABSTRACT

A mask pattern correcting method is comprised of a before-correction pattern edge defining step for defining an edge of a mask pattern, a deviated position setting step for setting a close point and a isolated point based on the deviation between the pattern edges of the mask pattern and the design pattern, an edge selecting step for correcting an edge located within specified distance from the isolated point, and selecting a mask pattern edge that will have smaller variation of the close point light intensity and larger variation of isolated point light intensity by the correction, a correcting step for correcting an edge to be corrected such that the isolated point light intensity after correction satisfies a criterion for correction, an after-correction pattern edge defining step for defining a pattern edge of the corrected mask pattern, and an end determining step for ending correction when the deviation between the defined after-correction pattern edge and the edge of the design pattern is within a specified criteria for determining ending correction.

4 Claims, 6 Drawing Sheets

METHOD OF CORRECTING MASK PATTERN

BACKGROUND OF THE INVENTION

1. Field of the Invention

The present invention relates to a method of correcting a mask pattern for obtaining a desired photoresist pattern that corresponds to a design pattern by optical lithography with a mask pattern.

2. Description of the Related Art

Making a semiconductor device includes a lithography process. The lithography process is a process to pattern a resist using a projection optical system type exposure system. The exposure system for patterning is equipped with a mask pattern called "reticle", and performs patterning on a resist with an image formed by transmission of light irradiated to the mask pattern.

When patterning is performed by the above-described exposure system with the mask pattern, and if the exposure system is used at the edge of its capability, the pattern shape obtained by the exposure becomes different from that of the design pattern.

To solve this problem, so-called "Optical proximity Correction" is employed, by which correction is made on the mask pattern so as to obtain a pattern shape similar to the design pattern.

The Optical Proximity Correction is described below with an example when patterning is performed by two exposures using a phase-shifting mask. The design pattern 10 is shown in FIG. 2. The phase-shifting mask and a Cr trim mask, which are used for patterning a resist to obtain the design pattern, are shown in FIGS. 3 and 4, respectively. The resist pattern 20 obtained by patterning by exposure while overlaying those masks is shown in FIG. 5.

The design pattern 10 has a shape, in which one rectangle is imposed between two wider rectangles. When patterning is simply performed with such pattern shape, the obtained resist pattern has rounded corners as shown in FIG. 5, and the width between the positions a' and b' in FIG. 5 which corresponds to the width between the positions a and b in FIG. 2 becomes larger than the width between the positions a and b.

The above-described phase-shifting mask 30 is Comprised of a Cr light-shielding section 31, 0° phase-shifter 32 and 180° phase shifter 33, which are included in the Cr light-shielding section 31. In the phase-shifting mask 30 shown in FIG. 3, the line defined by apex 34 and apex 35 is referred to as an edge 35, which is a line that can define the design pattern 10, resist pattern 20 or the like, in addition to the phase-shifting mask 30.

The optical proximity correction method is a method wherein a correction is made to a edge of the phase-shifting mask 30 in FIG. 3 and an edge of the Cr trim mask 40 in advance so as to make the image transferred by exposure more similar to the design pattern 10. More specifically, since the distance between the positions a' and b' in FIG. 5 tends to be made larger, the edge shape of the mask patterns such as phase-shifting mask 30 and Cr trim mask 40, which correspond to the positions a and b that correspond to the positions a' and b', are corrected.

The above-described mask pattern correcting method by the optical proximity correction is described in the patent references 1-3.

According to the patent reference 1 (JP2001-17497), in order to perform optical proximity correction, a mask pattern is modeled, light intensity distribution is simulated, and then correction is made to the mask pattern.

According to the patent reference 2 (JP12-162758), optical proximity correction is performed by first sorting the mask patterns, and then performing optical proximity correction to the sorted mask patterns.

According to the patent reference 3 (JP11-218899), a mask pattern is corrected by marking the circumference of the mask pattern with evaluation points, and then correcting the mask pattern with the evaluation points.

In the above-described methods, in order to obtain a desired mask pattern, the mask pattern is corrected by determining the intensity distribution of accumulated energy of light as two-dimensional light intensity distribution, and then repeating simulations based on the two-dimensional light intensity distribution.

In the above methods, the two-dimensional light intensity distribution, i.e. the intensity distribution of accumulated energy, needs to be determined in the whole mask pattern area. Thus, if many calculations of the two-dimensional light intensity distribution are required, it will take more time to correct the mask pattern, which deteriorates the work efficiency.

SUMMARY OF THE INVENTION

Therefore, the objective of this invention is to provide a method for obtaining a desired mask pattern without deteriorating the work efficiency.

To solve the above problem, the method of the present invention has constitutions as described below.

Constitution 1

The method of correcting a mask pattern to obtain a mask pattern that corresponds to a design pattern by optical lithography is comprised of a before-correction pattern edge defining step for defining a pattern edge of said mask pattern based on two-dimensional light intensity distribution in the whole mask pattern area; a deviated position setting step for setting positions in the design pattern, which have smallest deviation and have largest deviation between the defined edge and the pattern edge of said design pattern, as a close point and an isolated point, respectively; an edge selecting step for selecting an edge to be corrected by making slight amount of correction to each mask pattern edge located within specified distance from the isolated point, calculating the variations of light intensities at positions in the mask pattern, which correspond to the close point and the isolated point, and then selecting an edge to be corrected which will have smaller close point light intensity and larger isolated point light intensity by the correction; a correcting step for correcting the selected edges to be corrected by repeatedly correcting the pattern edge to be corrected so that the light intensity at the isolated point after correction satisfies a specified correction criterion; an after-correction pattern edge defining step for newly defining a pattern edge to be corrected based on secondary light intensity distribution of the whole mask pattern area, of which the edge to be corrected is corrected; and an end determining step for determining completion of correcting the mask pattern if the deviation between the newly defined pattern edge to be corrected and the design pattern edge is within a specified criterion for determining the completion of correction.

Constitution 2

The method of correcting a mask pattern to obtain a mask pattern that corresponds to a design pattern by optical lithography, comprising a before-correction pattern edge defining step for defining a pattern edge of the mask pattern based on two-dimensional light intensity distribution in the whole mask pattern area; a deviated position setting step for setting positions in the design pattern, which have smallest deviation and have largest deviation between the defined edge and the pattern edge of the design pattern, as a close point and an isolated point, respectively; an edge selecting step for selecting an edge to be corrected by making slight amount of correction to each mask pattern edge located within a specified distance from said isolated point, calculating the variations of light intensities at positions in the mask pattern, which correspond to the close point and the isolated point, and then selecting an edge to be corrected which will have smaller close point light intensity and larger isolated point light intensity by the correction; a correcting step for repeatedly correcting the selected edges to be corrected by correcting the selected pattern edge to be corrected, calculating the close point light intensity and the isolated point light intensity in the corrected mask pattern, again performing said edge selecting process when the close point light intensity is not within a specified criterion for edge selection, and again correcting the edge to be corrected such that the isolated point light intensity after correction satisfies the criterion; an after-correction pattern edge to be corrected based on secondary light intensity distribution of the whole mask pattern area, of which the edge to be corrected is corrected; and an end determining step for determining completion of correcting the mask pattern if the deviation between the newly defined pattern edge to be corrected and the design pattern edge is within a specified criterion for determining the completion of correction.

Constitution 3

The edge selecting process is featured by selecting an edge form mask pattern edges located within specified distance from the isolated point, where the edge can be corrected by optical proximity correction.

In the mask pattern correcting method of this invention, a close point and an isolated point between the defined pattern edge and the pattern edge of the design pattern are first determined, and then very small amount of correction is made to each edge of the mask pattern which is located within specified distance from the isolated point. Then, edges to be corrected which has small variation of close point light intensity and has large variation of isolated point light intensity at the mask pattern side are selected, and correction is repeatedly made to those selected edges so as to satisfy a specified criterion for correction. Once the pattern edge to be corrected, which is newly defined based on the after-correction mask pattern, and the edge of the design pattern satisfy the specified criterion for determining completion of correction, correction of the mask pattern is ended, so that effects of the light intensity of pattern edge which does not require correction is suppressed. The mask pattern edge that has larger deviation from the pattern edge of the design pattern is selectively corrected. Therefore, two-dimensional light intensity distribution does not have to be frequently determined in the whole mask pattern area, and therefore the processing time can be reduced and the work efficiency can be improved.

DESCRIPTION OF THE PREFERRED EMBODIMENTS

Referring now to annexed drawings, embodiments of this invention will be fully described below.

First Embodiment

Figure 1:
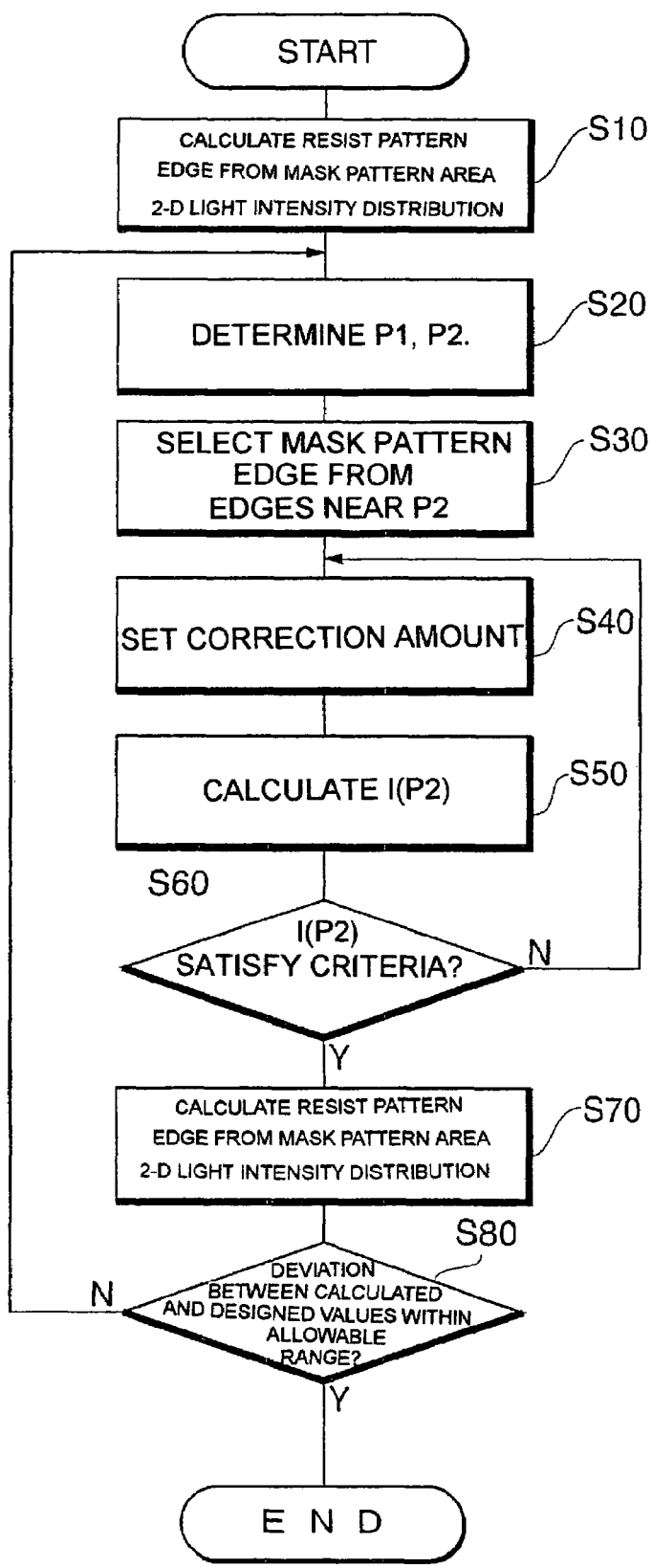
FIG. 1 is a flowchart of the mask pattern correcting method according to the first embodiment of the invention.
Figure 2:
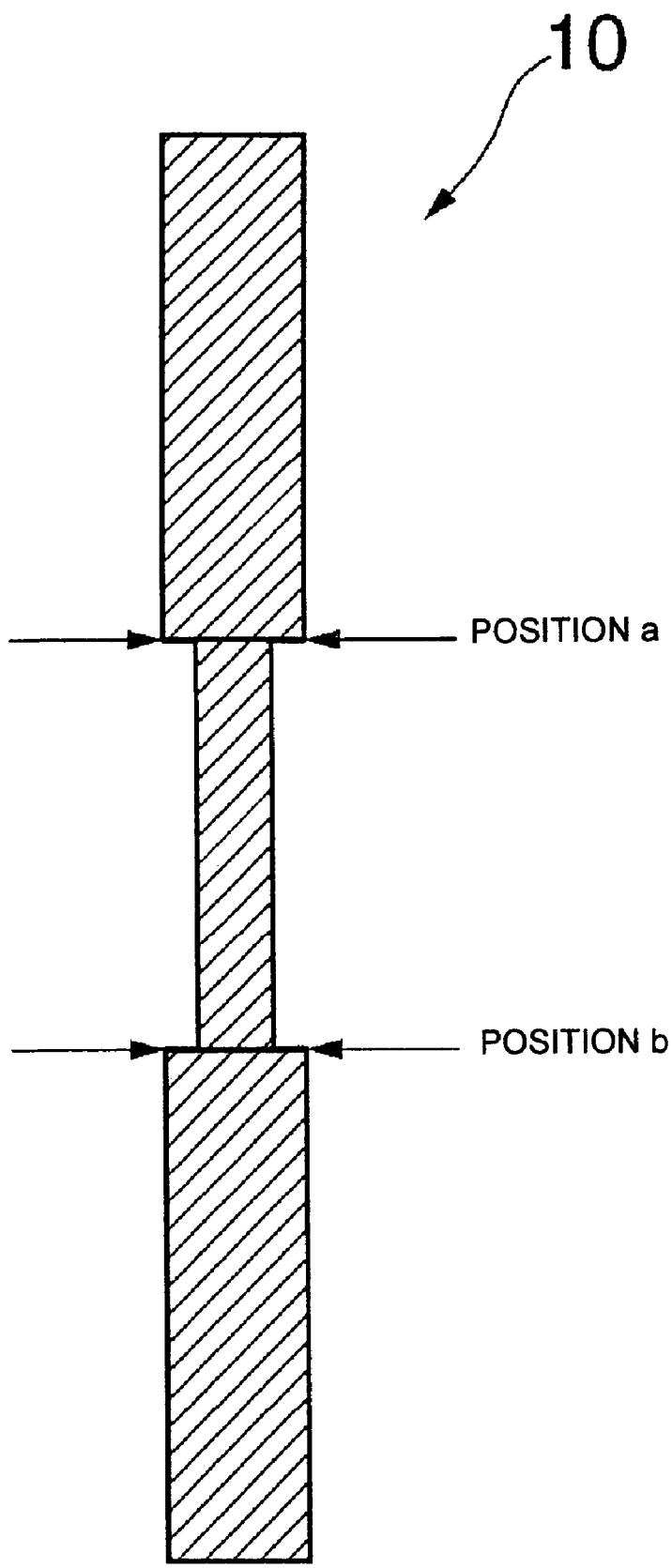
FIG. 2 is a diagram showing a design pattern.
Figure 3:
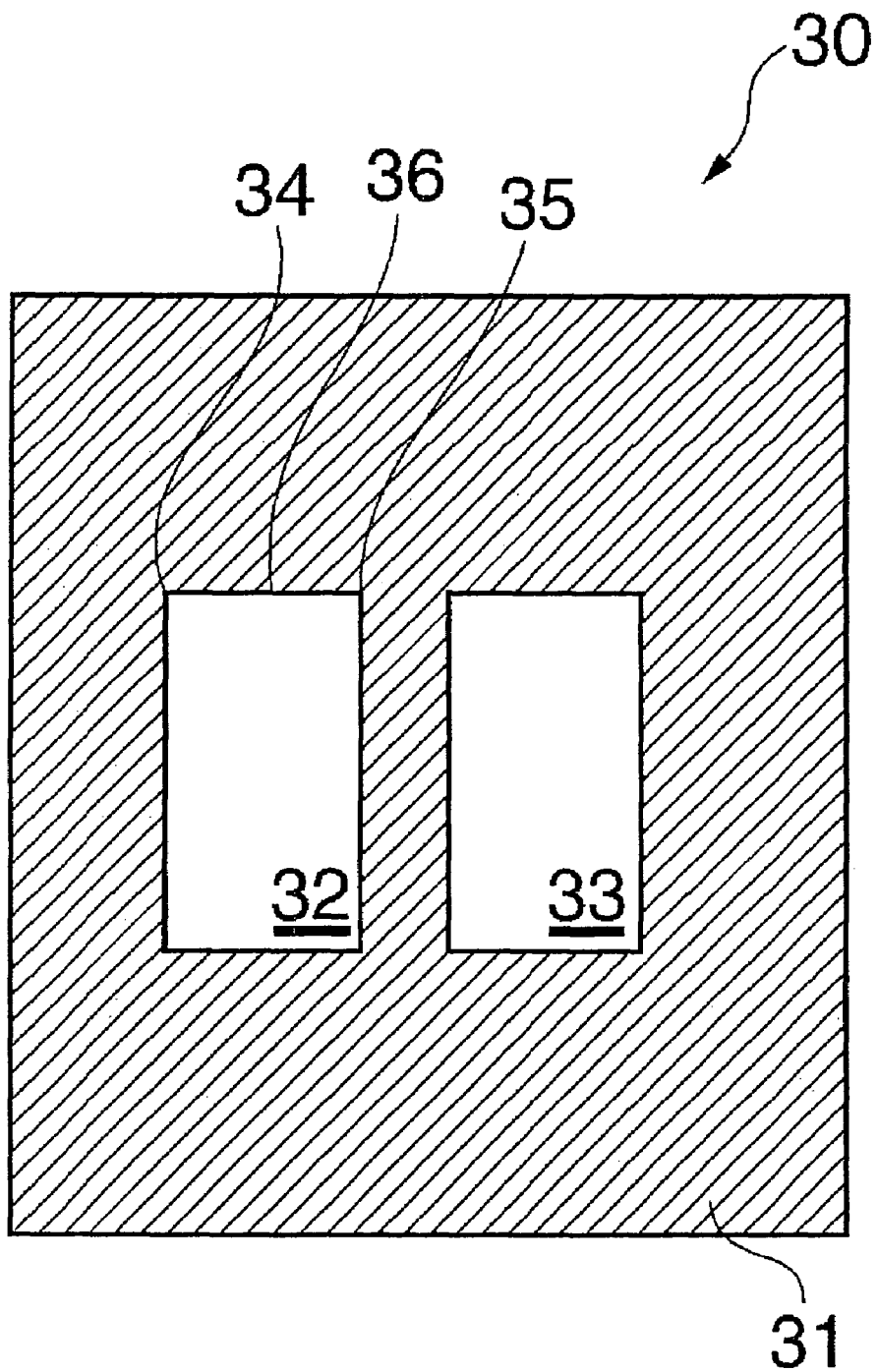
FIG. 3 is a diagram of a phase-shifting mask.
Figure 4:
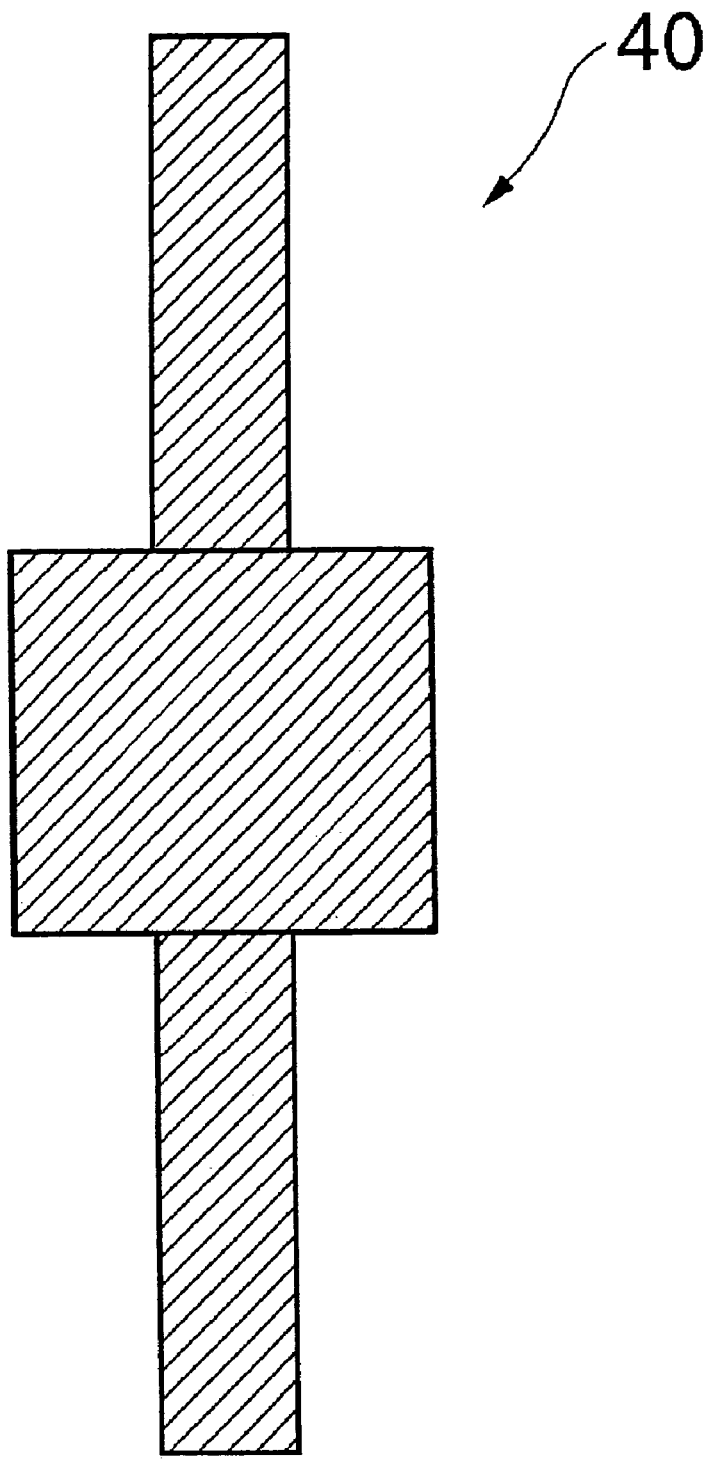
FIG. 4 is a diagram showing a Cr trim mask.
Figure 5:
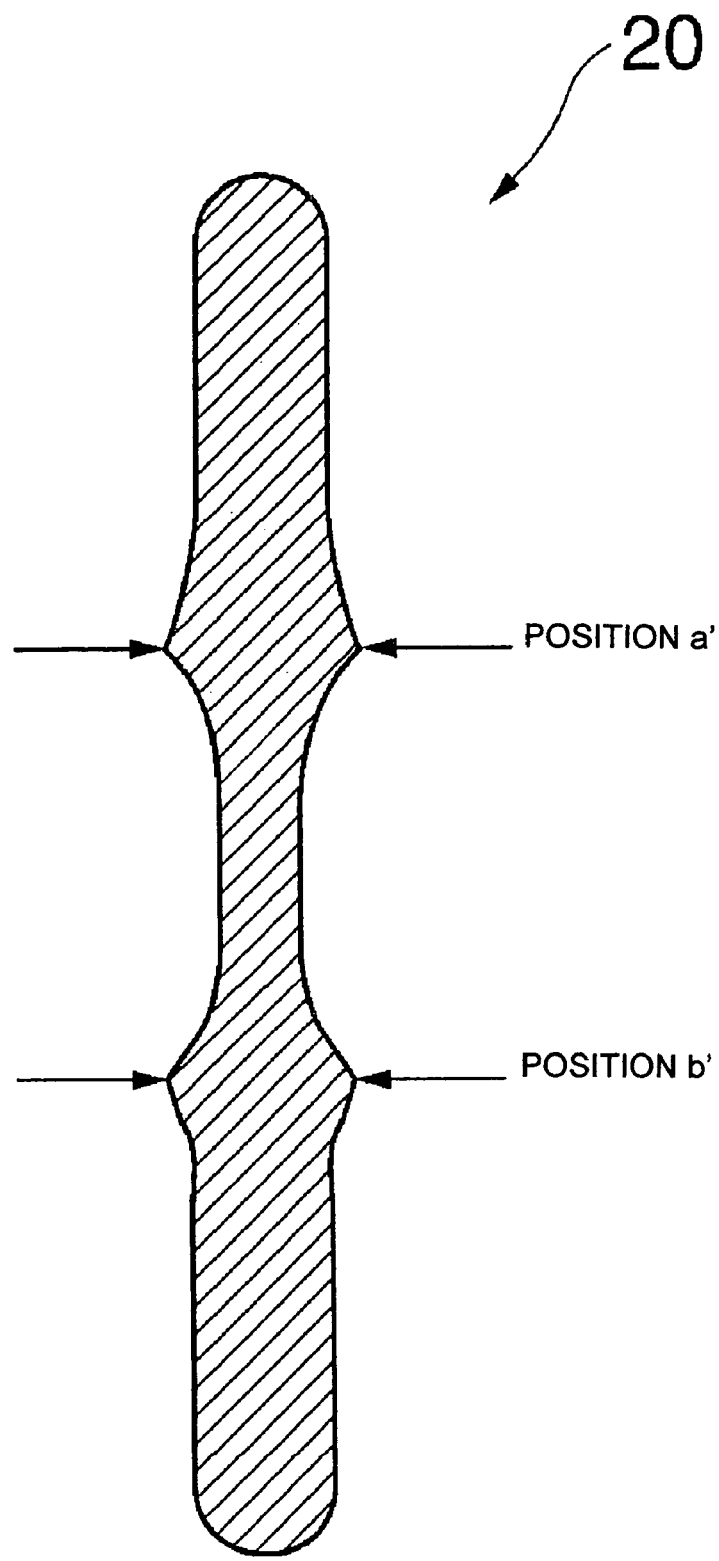
FIG. 5 is a diagram showing a resist pattern.

The mask pattern correcting method of this invention is a method to make corrections to the mask pattern is advance so as to make the resist pattern which is transferred to a resist (shown in FIG. 5) similar to the design pattern by performing patterning using mask patterns such as the phase-shifting mask FIG. 3) and Cr trim mask (FIG. 4) to transfer the design pattern of FIG. 2 to a resist. More specifically, the method of this invention is comprised of a before-correction pattern edge defining edge, a deviated position setting process, an edge selecting process, a correcting process, an after-correction pattern edge defining process and an end determining process. Each process is described below, referring to the flowchart of FIG. 1. In the before-correction pattern edge defining process, simulation is first performed using a mask pattern to be corrected. Then, two-dimensional light intensity distribution in the whole resist pattern area obtained by the simulation is determined as two-dimensional light intensity distribution of the whole before-correction mask pattern area, and before-correction pattern edge in the mask pattern is defined through comparing the values of determined two-dimensional light intensity with a specified threshold (Step S10).

Next, the deviation between the pattern edge determined in the before-correction pattern edge defining process and the pattern edge of the design pattern is determined. More specifically, in the deviation position setting process, the position of the before-correction pattern edge that corresponds to the position a in the design pattern of FIG. 2 is determined, and the deviation between the determined position and the position a in the design pattern is determined. Based on the deviation determined in this way, a position having smallest deviation and a position having largest deviation are set as a close point P1 and an isolated point P2, respectively (Step S20).

When plural isolated points P2 exist, one arbitrary point is first selected from those plural isolated points. On the other hand, if plural close points P1 exist, a close point that is closest to the isolated point P2 is selected.

Then, in the edge selecting process, for example in case of the phase-shifting mask 30 shown in FIG. 3, a line defined by the apex 34 and the apex 35 is referred to as an edge 36. An edge to be corrected is selected from the edges defined in this way, particularly selected from edges located near the isolated point P1 ( Step S30).

The edge selecting process is described in more detail below.

The variation of light intensity at the close point P1 $dI(P1)/dMn$ and the variation of light intensity at the isolated point $dI(P2)/dMn$ are determined for each edge Mn of the mask pattern which is located within specified distance from the isolated point P2 when the edge of the mask pattern is moved for a slight amount dMn. Then, an edge Mn of the mask pattern which has 0 or minimum $dI(P1)/dMn$ and maximum $dI(P2)/dMn$ is selected as an edge to be corrected.

Since the edge to be corrected is selected based on the variation after determining light intensities of the close point P1 and the isolated point P2, two-dimensional light intensity at each point in the whole mask pattern area does not have to be determined, and therefore the processing time can be reduced.

In addition, since an edge having large variation at the isolated point P2 and having small variation at the close point P1 is selected as an edge to be corrected, potential effect of the correction can be avoided at the close point, where the deviation from the design pattern is small.

Here, as for the aforementioned specified distance, for example, twice the exposure wavelength can be used as the distance that can be corrected by optical proximity correction. Of course, the specified distance does not have to be twice the exposure wavelength, but can be changed as necessary.

The correcting process is shown in Steps S40-S60.

First, correction is made to the selected edge of the mask pattern (Step 40). For example, the correction of the edge 36 of the phase-shifting mask (FIG. 3) as a mask pattern is made for slight amount so as to extend or shorten the rectangular shape of the 0° phase-shifter 31 in the longitudinal direction.

The light intensity at the isolated point P2 in the mask pattern corrected as described above is determined (Step S50).

Comparing the determined isolated point light intensity I(P2) with a specified criterion for correction, it is determined if the determined light intensity I(P2) satisfies the criterion for correction (Step S60). If it is determined as the determined I(P2) does not satisfies the correction criterion, it will return to Step 40 and correction is again made to the selected mask pattern.

Once it is determined as the determined I (P2) satisfies the correction criterion, it proceeds to the after-correction pattern edge defining process. More specifically, by determining two-dimensional light intensity in the whole after-correction mask pattern area, and then comparing with the specified threshold, an after-correction pattern edge in the mask pattern is defined (Step S70).

After defining the after-correction pattern edge, in the end determining process, deviation of the defined pattern edge from the design pattern edge is determined, and it is determined if the deviation satisfies the criterion for determining completion of correction (Step S80). If it does not satisfy, the above-described edge selecting process, which is a process from Step 30, is performed.

On the other hand, if it is determined that the deviation of the pattern edge defined after correction from the design pattern edge satisfies the specified criterion for determining completion of correction, correction of the mask pattern is ended.

As described above, according to the mask pattern correcting method of the Working Example 1, the pattern edge is selected based on the light intensity distributions at close point and the isolated point, which are measures for deviation of the mask pattern from the design pattern, and correction is repeatedly made to the edge to be corrected such that the light intensity at the isolated point satisfies the specified criterion for correction. Therefore, determination of two-dimensional light intensity distribution does not have to ne frequently repeated for correction, and therefore the time required for correcting the mask pattern can be reduced.

Figure 6:
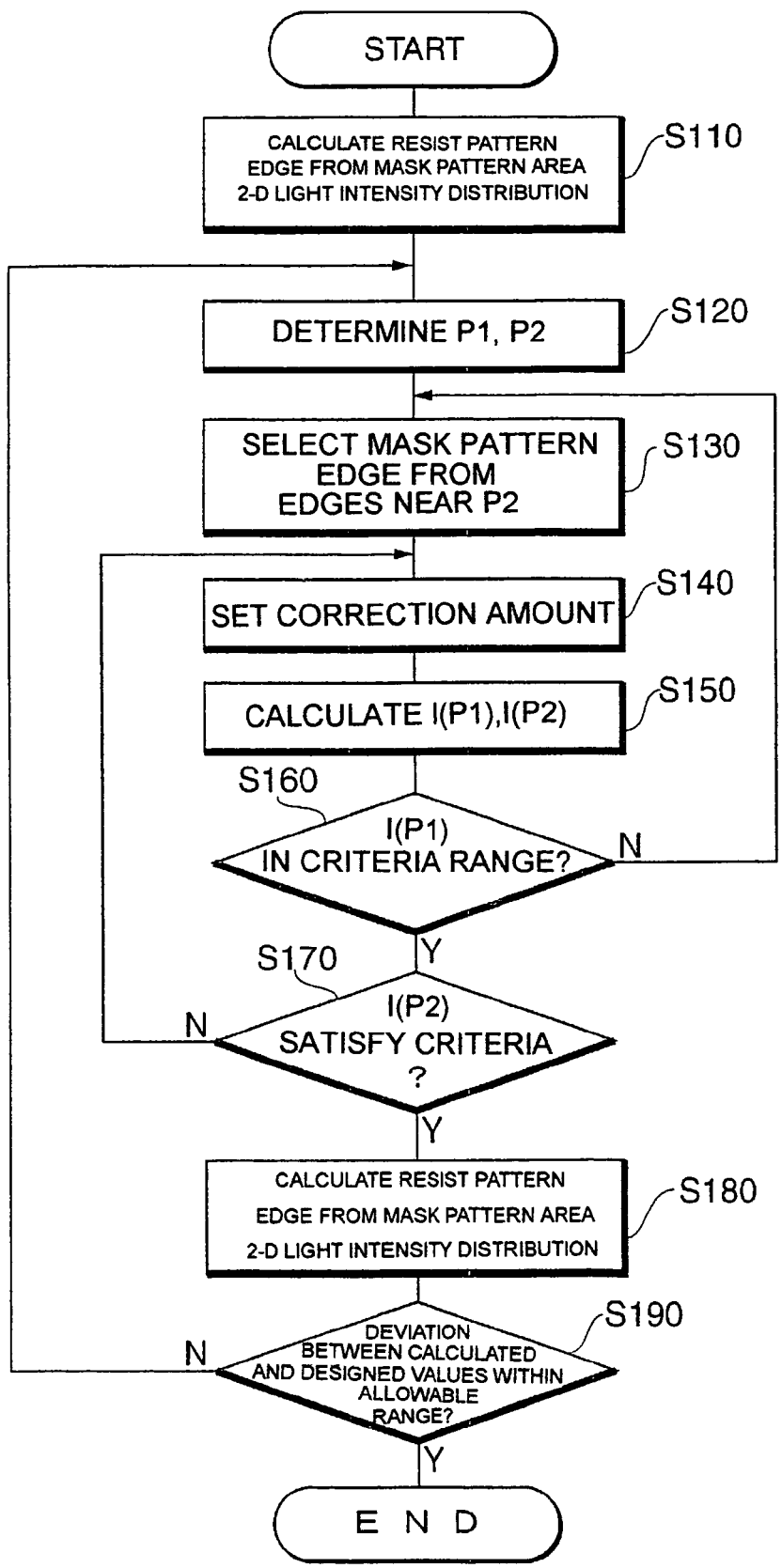
FIG. 6 is a flowchart of the mask pattern correcting method according to the second embodiment of the invention.

The method of correcting a mask pattern which is featured by another correcting process, in which an edge to be corrected is newly selected based on the light intensity during the correction of the mask pattern, is described below referring to the flowchart of FIG. 6.

The mask pattern correcting method of the second embodiment is comprised of a before-correction pattern edge process, a deviated position setting process, an edge selecting process, a correcting process, an after-correction pattern defining process and an end determining process.

The content of the before-correction pattern edge process, the deviated position setting processing, the edge selecting process, the after-correction pattern defining process and the end determining process is similar to each of the first embodiment which is described above. In the flowchart of FIG. 6, the before-correction pattern edge process, the deviation position setting process, the edge selecting process, the deviation position setting process, the edge selecting process, the after-correction pattern defining process and the end determining process correspond to the Steps S110, S120, S130, S180 and S190, respectively.

Here, the explanation of the content of each process which is similar to the first embodiment is omitted, and the content of the correcting process in this embodiment will be fully described below with reference to the Steps S140-S170.

After selecting an edge of the mask pattern which is to be corrected in the edge selecting process in Step 130, a correction is made to the selected edge similarly to the first embodiment described above (Step S140).

Next, the light intensity I(P1) at the close point P1 and the light intensity I(P1) at the close point P2 in the mask pattern, of which the selected edge was corrected, are determined (Step S150). In the aforementioned first embodiment, only the isolated point light intensity I(P2) was determined, but the close point light intensity is also determined in this embodiment.

Thereafter, if the close point light intensity I(P1) and the specified criterion for edge selection are compared and the close point light intensity does not satisfy the criterion for edge selection, the process from the Step S130, i.e. the edge selecting process, is performed to newly select a pattern edge (Step S160). At this time, the amount of correction made for the corrected edge Mn will be kept as a reference value for correcting newly selected edge, i.e. Step S130. For example, the comparison with criterion for edge selection is expressed by the following relationship of Eq. 1, where the threshold of the light intensity is Ith.

$$0.95 \times Ith < I(P1) < 1.05 \times Ith \quad \text{(Eq. 1)}$$

When an edge to be corrected is newly selected, an edge having larger dI(P2)/dMn (n=1, 2, ...) is selected. Then, the close point light intensity I(P1) is determined correcting the selected edge, and it is determined if the close point light I(P1) is within the criterion for selection determination. The above-described process is repeatedly performed such that the close point light intensity I(P1) satisfies the criterion for edge selection. When the pattern edge Mn becomes 0 in this repeating process, the range of the criterion for edge selection which is shown in Eq. 1 is broaden, and the edge Mn of the mask pattern which was originally selected, is corrected as an edge to be corrected.

If it is determined that the close point light intensity I(P1) is within the criterion for edge selection, the isolated point light intensity I(P2) is then compared with the specified criterion for correction. If the isolated point light intensity is not within the criterion for correction, the process from Step S140 is performed again in order to again correct the selected edge (Step S170). For example, the comparison and determination with the criterion for correction is expressed by the following relationship of Eq. 2, where the threshold of the light intensity is Ith $$0.95 \times Ith = I(P1) \quad \text{(Eq. 2)}$$

After repeating a correction to the selected edge until the relationship of Eq. 2 is satisfied, the after-correction pattern edge defining process is performed similarly to the aforementioned second embodiment. More specifically, a pattern edge after correction in a mask pattern is defined by determining the light intensity distribution of the whole mask pattern area, and then comparing with the specified threshold (Step S180). Then, the end determining process is performed for determining if the pattern edge defined after correction and the edge of the designed edge satisfy the criterion for determining completion of correction (Step S190). If the criterion for determining completion of correction is not satisfied, the deviated position setting process, which is a process from Step S120, is performed.

As described above, according to the mask pattern correcting method of the second embodiment, correction is made such that the close point light intensity in the mask pattern is within the allowable range and the isolated point light intensity is corrected so as to be within the correction criterion. Therefore, the number of times to return to the Step S120 in the determination at the Step 190 can be reduced. Accordingly, with the mask pattern correcting method of the second embodiment, the number of times for determining two-dimensional light intensity distribution of the whole corrected mask pattern area can be reduced, and therefore processing time can be reduced.

The invention claimed is:

1. A method of correcting a mask pattern to obtain a desired mask pattern that corresponds to a design pattern by optical lithography, comprising the steps of:

defining a pattern edge of said mask pattern based on a two-dimensional light intensity distribution in a whole area of the mask pattern;

setting positions in said design pattern, which have a smallest deviation and have a largest deviation between the pattern edge of the mask pattern and a pattern edge of said design pattern, as a close point and an isolated point, respectively;

selecting an edge to be corrected by making a slight amount of correction to the pattern edge of the mask pattern located within a specified distance from said isolated point, calculating variations of light intensities at positions, which correspond to said close point and said isolated point, and then selecting the edge to be corrected which has a smaller variation of the light intensity at the close point and a larger variation of the light intensity at the isolated point by the correction;

correcting the edge to be corrected by repeatedly correcting the edge to be corrected so that the light intensity at the isolated point after the correction satisfies a specified correction criterion;

defining a pattern edge to be corrected based on the secondary light intensity distribution in the whole area of the mask pattern, of which said edge to be corrected is corrected; and determining completion of correcting said mask pattern when a deviation between the pattern edge to be corrected and the pattern edge of the design pattern is within a specified criterion for determining completion of the correction.

2. A method of correcting a mask pattern to obtain a desired mask pattern that corresponds to a design pattern by optical lithography, comprising the steps of:

defining a pattern edge of said mask pattern based on a two-dimensional light intensity distribution in a whole area of the mask pattern;

setting positions in said design pattern, which have a smallest deviation and have a largest deviation between the pattern edge of the mask pattern and a pattern edge of said design pattern, as a close point and an isolated point, respectively;

selecting an edge to be corrected by making a slight amount of correction to the pattern edge of the mask pattern located within a specified distance from said isolated point, calculating variations of light intensities at positions, which correspond to said close point and said isolated point, and then selecting the edge to be corrected which has a smaller variation of the light intensity at the close point and a larger variation of the light intensity at the isolated point by the correction;

correcting the edge to be corrected, calculating the light intensity at the close point and the light intensity at the isolated point after the correction, selecting the edge to be corrected one more time when the light intensity at the close point is not within a specified criterion for edge selection, correcting said edge to be corrected one more time when the light intensity at the isolated point after the correction does not satisfy a specified criterion, and repeating the selection of said edge to be corrected and the correction of said edge to be corrected until the light intensities at the close point and the isolated point both satisfy the criterions;

defining a pattern edge to be corrected based on the secondary light intensity distribution of the whole area of the mask pattern, of which said edge to be corrected is corrected; and determining completion of correcting said mask pattern when a deviation between the pattern edge to be corrected and the pattern edge of the design pattern is within a specified criterion for determining completion of the correction.

3. The method of correcting a mask pattern according to claim 1, wherein, in the step of selecting the edge to be corrected, said pattern edge of the mask pattern is located within a specified range from said isolated point, where optical proximity correction is applicable.

4. The method of correcting a mask pattern according to claim 2, wherein, in the step of selecting the edge to be corrected, said pattern edge of the mask pattern is located within a specified range from said isolated point, where optical proximity correction is applicable.

* * * * *